United States Patent [19]

Ridgway

[11] Patent Number: 4,770,483

[45] Date of Patent: Sep. 13, 1988

[54] ELECTROOPTIC SAMPLING APPARATUS FOR SAMPLING ELECTRICAL AND OPTICAL SIGNALS

[75] Inventor: Richard W. Ridgway, Columbus, Ohio

[73] Assignee: Battelle Memorial Institute, Columbus, Ohio

[21] Appl. No.: 812,165

[22] Filed: Dec. 23, 1985

[51] Int. Cl.$^4$ .......................... G02B 6/10; H03M 1/00; G06F 7/56

[52] U.S. Cl. ............................ 350/96.13; 350/96.14; 350/96.16; 364/713; 364/822; 341/137

[58] Field of Search ............... 350/96.10, 96.11, 96.12, 350/96.13, 96.14, 96.15, 96.16, 356; 364/713, 822, 715, 823, 824; 340/347 M

[56] References Cited

U.S. PATENT DOCUMENTS

| | | | |
|---|---|---|---|
| 3,614,451 | 10/1971 | Gunn | 350/356 |
| 4,026,632 | 5/1977 | Hill et al. | 350/96.15 X |
| 4,030,840 | 6/1977 | Lawton et al. | 356/256 |
| 4,042,814 | 8/1977 | Taylor | 364/713 X |
| 4,058,722 | 11/1977 | Taylor | 340/347 M X |
| 4,288,785 | 9/1981 | Papuchon et al. | 350/46.14 X |
| 4,395,702 | 7/1983 | Gottlieb et al. | 340/347 M |
| 4,441,096 | 4/1984 | Evanchuk | 340/347 M |
| 4,505,587 | 3/1985 | Haas et al. | 350/96.14 X |
| 4,566,077 | 1/1986 | Schuöcker et al. | 364/713 X |
| 4,604,707 | 8/1986 | Yanashita et al. | 364/713 X |
| 4,613,204 | 9/1986 | Verber et al. | 350/96.14 |
| 4,707,060 | 11/1987 | Cheo et al. | 350/96.14 |
| 4,714,312 | 12/1987 | Thaniyavarn | 350/96.14 |

OTHER PUBLICATIONS

Ridgway et al., "A Spatial Sampler Using Itegrated Optic Techniques" J of Lightwave Tech., vol. LT-4, No. 10, Oct. 1986, pp. 1514–1522.
Schwarte, "New Results of an Experimental Sampling System . . . " Elect. Lett., vol. 8, No. 4, 2/72, pp. 94–96.
Yamashita et al., "An Approximate Dispersion Formula . . . " IEEE, pub. 12/19, pp. 1036–1038.
Taub et al., "Principles of Communications Systems" (no date), McGraw-Hill, pp. 168–175 and 252–253.
Kawaguchi et al., "Generation of Single Longitudinal Mode . . . " Elect. Lett., 8/83, vol. 19, No. 17, pp. 668–669.

(List continued on next page.)

Primary Examiner—William L. Sikes
Assistant Examiner—Brian M. Healy
Attorney, Agent, or Firm—Philip M. Dunson

[57] ABSTRACT

High speed integrated optic devices for sampling transient RF and microwave signals. A series of electrooptic couplers are spaced apart along an integrated-optic waveguide beneath a coplanar RF stripline. A traveling wave electrical signal propagetes on the RF stripline, generating an electric field across each coupler, and thus changing its coupling characteristics. A short optical pulse propagates in a direction opposite to the electrical signal, passing sequentially through the electrooptic couplers, and thus causing a small amount of light to couple into each one of a series of output waveguides and propagate on to an optical detector. The amount of coupled light is dependent on the local electric field induced by the electric signal. Each detector integrates the energy of the coupled optical pulse in its respective output waveguide, to determine the associated instantaneous amplitude of the electrical signal. The sampling rate is determined by the spatial distance between the electro-optic couplers and the velocities of the optical pulse and the electrical signal. Transient signals can be analyzed at rates in excess of 30 giga-samples per second.

Intensity-modulated optical signals can be sampled also, using a short electrical pulse. The main integrated-optical waveguide propagates the intensity modulated optical signal through the electro-optic couplers. A short electircal pulse propagates down the RF stripline in a direction opposite to the optical signal and, again, induces an electric field which changes the coupling characteristics of the couplers. The optical sampler can be integrated into an optical fiber communication system to provide a new means of detecting and analyzing optical signals.

15 Claims, 3 Drawing Sheets

OTHER PUBLICATIONS

Lin et al., "Simple Picosecond Pulse Generation . . ." Elect. Lett., 7/80, vol. 16, No. 15, pp. 600–602.

Marcatili, "Optical Suppicosecond Gate" Applied Optics, vol. 19, No. 9, 5/80, pp. 1468–1476.

Yariv, Introduction to Optical Electronics" 2nd Ed. Holt, Rinehart and Winston (no date), pp. 326–331.

Millman et al., "Integrated Electronics: Analog and Digital Circuits and Systems" McGraw-Hill (no date), pp. 544–547.

Burns et al., "Ti Diffusion in Ti:Li $NbO_3$ Planar and Channel Optical Waveguides" J. Appl. Phys., vol. 50, No. 10, 10/79, pp. 6175–6182.

Bulmer et al., "Polarization Characteristics of Li $NbO_3$ . . ." J. of Lightwave Tech., vol. LT-1, No. 1, 3/83.

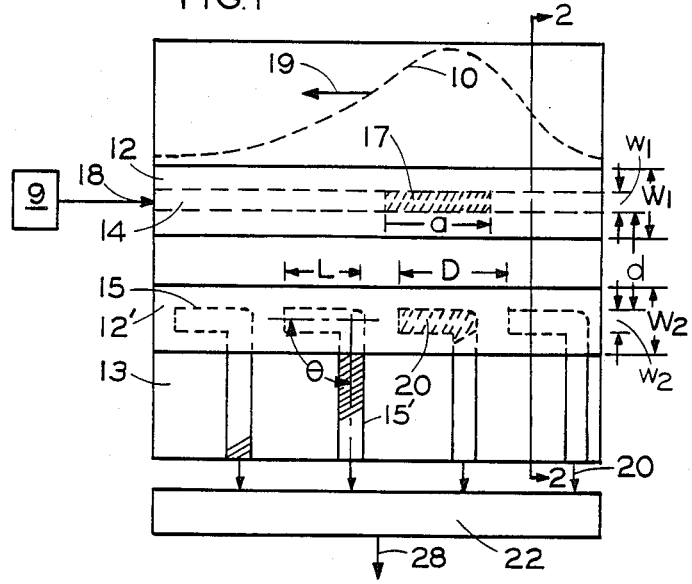
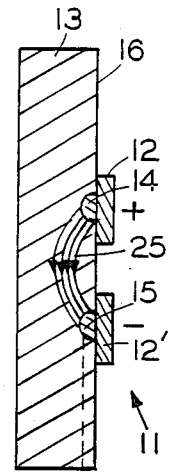
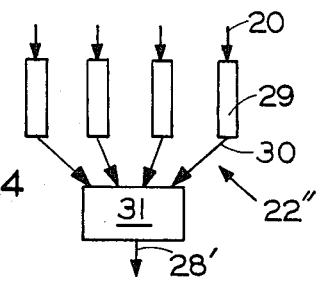
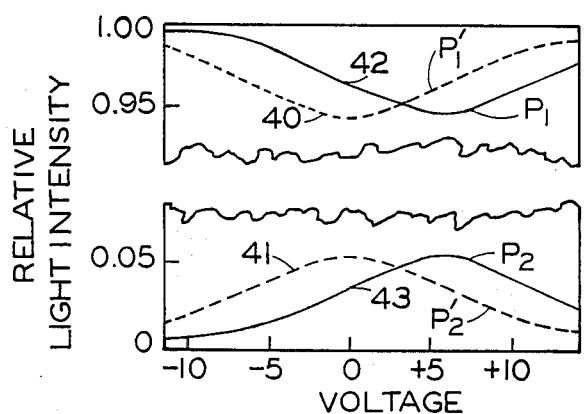

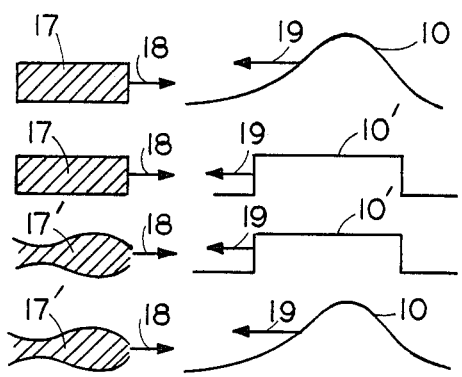
FIG. 6
FIG. 7
FIG. 8
FIG. 9
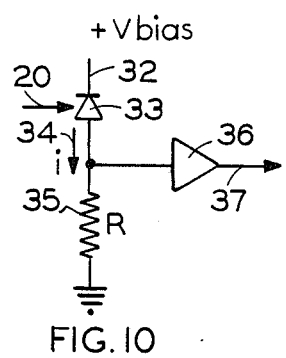
FIG. 10
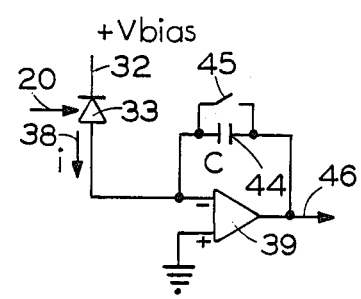
FIG. 11
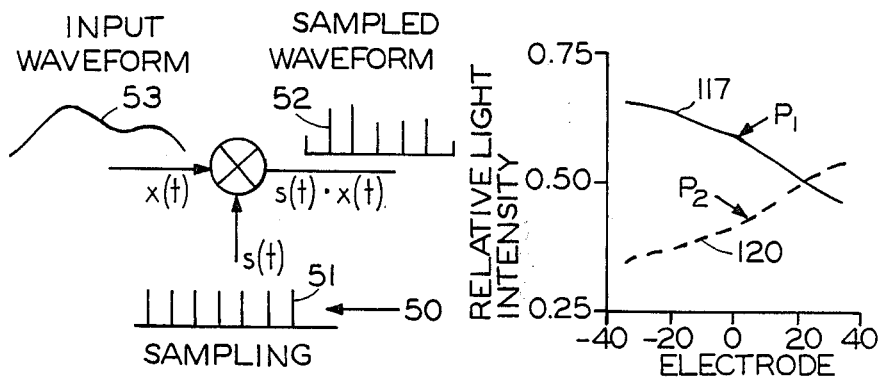
FIG. 12
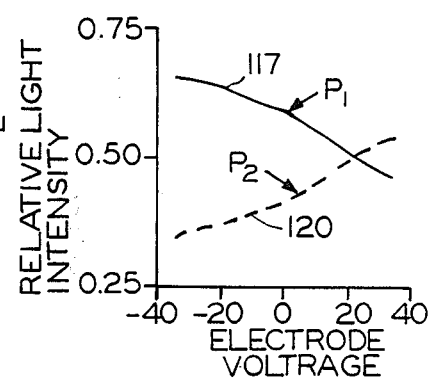
FIG. 13

ELECTROOPTIC SAMPLING APPARATUS FOR SAMPLING ELECTRICAL AND OPTICAL SIGNALS

FIELD OF THE INVENTION

This invention relates to methods and apparatus for sampling high-frequency electrical or optical signals. It has to do mainly with high speed electrooptic samplers for analyzing transient, radio frequency or microwave signals, or intensity modulated optical signals.

BACKGROUND OF THE INVENTION

Sampling oscilloscopes are used to display repetitive waveforms of high frequency content greater than a few gigahertz. For non-repetitive, transient, isolated (single shot) waveforms, sampling oscilloscopes are limited to waveforms of relatively low frequency content (less than a gigahertz).

Electrically strobed sampling gates are commercially available. Analog/digital converters, diodes, and transistors are used at low frequencies in the kilohertz and megahertz region. In the gigahertz and higher frequency range, sampling oscilloscopes use balanced diode bridges on the 2,4 or 6 diode configurations. However, the dynamic range of the fast diode sampling gates is limited by the low reverse voltage breakdown of the diodes which can cause severe waveform distortion from electrical strobe feedthrough.

Commercially-available samplers can analyze repetitive waveforms with frequency contents of up to about 14 gigahertz. However, single-shot sampling devices have been limited to about 500 megahertz because of bandwidth limitations of the processing electronics, the analog switches, and the conversion rates of analog-to-digital converters.

Multiple sampling provides an alternative approach for single-shot sampling of non-repetitive waveforms. An array of electrically strobed switches spaced along a stripline can be activated simultaneously to take a picture of the waveform. For example, a multiple sampler using a series/parallel arrangement of 40 2-diode sampling gates spaced an equivalent of 45 picoseconds apart was shown to function over a bandwidth of about 3 gigahertz with multivolt sensitivity [Schwarte, R., "New Results of an Experimental Sampling System for Recording Fast Single Events", Electronic Letters, 8 (4), 94–96, February 24, 1972]. Among the difficulties with this system, was the accuracy of ±10 picoseconds required for the electrical pulse to each of 40 switches.

An optically strobed photoconductive sampling gate is one alternative to an electrically strobed diode gate that avoids the problems of electrical strobe feedthrough. For example, U.S. Pat. No. 4,030,840 of Lawton et al describes a waveform sampler using a gallium-arsenide photoconductor as the sampling gate and a conventional oscilloscope for display and to provide the strobe synchronization for repetitive pulses of light from a laser to sample a repetitive high-frequency waveform. The time resolution achievable with such a sampling device is limited by the duration of the optical impulses and the free-carrier lifetime of the photoconductor.

The above limitations related to photoconductor material or electrically strobed switches are avoided in the present invention based on electrooptic technology.

This invention is described in further complete detail in the dissertation entitled, "High Speed Integrated-Optic Sampler for Transient RF and Microwave Signals", by Richard William Ridgway (the applicant herein), submitted to the Graduate School of The Ohio State University in partial fulfillment of the requirements for the degree of Doctor of Philosophy, December, 1985. This dissertation is incorporated herein by reference as fully as if it were presented in complete text.

SUMMARY OF THE INVENTION

Typical apparatus according to the present invention for sampling electrical and optical signals, to show their waveforms, comprises substrate means comprising optical material having a planar surface, stripline means comprising first and second parallel electrical conducting means adjacent to the planar surface of the substrate means, first optical waveguide means on or integrated into the planar surface of the substrate adjacent to the first conducting means, a plurality of electrooptical coupling means on or integrated into the planar surface of the substrate adjacent to the second conducting means and spaced apart therealong, means for propagating a traveling wave electrical signal along the stripline means in a first direction, means for propagating an optical signal along the stripline means in a second direction that is parallel to the first direction, and second optical waveguide means for propagating light from each coupling means to respective means responsive thereto.

Typically the second direction is opposite to the first direction. Alternatively the second direction is the same as the first direction, and the electrical signal propagates at a velocity different from that of the optical signal.

Each electrooptic coupling means typically comprises third optical waveguide means, and typically the first and third optical waveguide means differ in width, depth, shape, index of refraction, or other optical characteristic.

The electrical signal that propagates along the stripline means generates an electrical field across each coupling means and thus changes its coupling characteristics. Where the electrical signal has a waveform that is to be analyzed using the apparatus, the optical signal typically comprises a pulse having substantially constant intensity. Where the optical signal has an intensity-modulated waveform that is to be analyzed using the apparatus, the electrical signal typically comprises a pulse having substantially constant amplitude.

Each means responsive to the light propagated from the coupling means may comprise optical analog to digital conversion means, and digital processing means responsive thereto. Alternatively each means responsive to the light propagated from the coupling means may comprise optical to electrical signal conversion means, and electrical signal processing means responsive thereto.

Typically the means responsive to the light propagated from the coupling means comprise photodetector means and integrating means responsive thereto.

BRIEF DESCRIPTION OF THE DRAWINGS

FIG. 1 is a schematic plan view of a typical electrooptic sampler according to the present invention.

FIG. 2 is a sectional schematic view of one electrooptic coupler as indicated at 2—2 in FIG. 1.

FIG. 3 is a functional block diagram of one embodiment of the sample processing portion of the electrooptic sampler for electrical signal processing.

FIG. 4 is a functional block diagram of an alternative embodiment of the sample processing portion of the electrooptic sampler for optical signal processing.

FIG. 5 is a graph showing light coupling as a function of signal voltage for a typical asymmetric coupler compared to a symmetric coupler.

FIGS. 6-9 are schematic representations of four embodiments of the electrooptic sampler for sampling electrical signals with an optical pulse FIGS. 6 and 7 and sampling amplitude modulated optical signals with an electrical pulse FIGS. 8 and 9.

FIG. 10 is a schematic diagram of typical circuitry for a conventional optical detector.

FIG. 11 is a schematic diagram of typical circuitry for an integrating optical detector.

FIG. 12 is a schematic representation of an ideal sampler.

FIG. 13 is a graph of relative light intensity versus electrode voltage for an experimental electrooptic coupler.

DETAILED DESCRIPTION OF THE INVENTION

Figure 14:
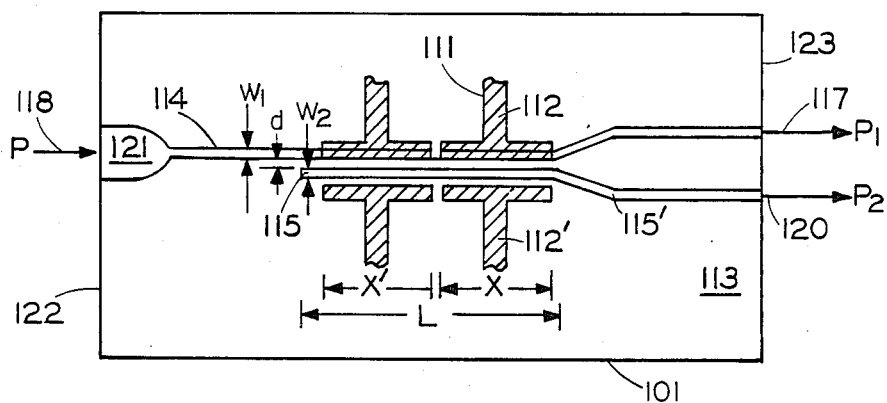
FIG. 14 is a schematic plan view of an experimental electrooptic coupler.

A radio frequency signal 10 to be sampled is spatially distributed along an electrical transmission line which is typically a stripline comprising two coplanar conductors 12,12' on the surface of an electrooptic substrate 13.

Referring now to FIGS. 1 and 2, channel waveguides 14,15 are provided at the surface 16 of the substrate 13 adjacent to the coplanar conductors 12,12' as shown in FIG. 2. The main channel waveguide 14 is continuous adjacent the first conductor 12 or traveling wave electrode. Adjacent the second conductor 12' or ground strip, there are a plurality of segments of channel waveguide 15 referred to as couplers or electrooptic couplers or optical switches. For illustration in FIG. 1, only four identical couplers are shown. However, any number of couplers can be used in the sampler depending on the sampling requirements of the device. Each coupler comprises a segment of channel waveguide 15 essentially parallel to the main channel waveguide 14 and an extension of the segment of channel waveguide 15' at an angle which directs the collected light portions 20 to light processing means 22. The angle is usually between 90° and 180° and typically between 175° and 180° to minimize attenuation of the coupled light portion 20 at bends in the channel waveguide 15,15'.

An electrooptic coupler 11, as shown in FIG. 2, comprises the main channel waveguide 14, the segment of channel waveguide 15, the first conductor 12 referred to as the traveling wave electrode, and the second conductor 12' referred to as the ground strip of the coplanar stripline.

In typical sampling as shown in FIG. 1, a pulse of light 17 from a light source 9, such as a laser, is propagated through the continuous main channel waveguide 14 in a direction 18 opposite to the direction of propagation 19 of the electrical signal 10 in the adjacent conductor 12. Each segment of channel waveguide 15 collects a portion 20, of the pulse of light 17 by evanescent coupling from the continuous channel waveguide 14 by the electrooptic effect in proportion to the local voltage in the electric pulse 10 on the conductors 12,12' of the stripline coincident with the optical pulse 17. The information about the waveform 10 sampled at each electrooptic coupler 11 is contained in the coupled light portion 20 which is directed along the extension of the channel waveguide 15' to light processing means 22. The light processing means 22 comprises optical signal processing devices or electrical signal processing devices or combinations thereof which are well-known.

For example as shown in FIG. 3, typical light processing means 22' comprises a plurality of photoconductors 23 which convert the light pulse portions 20 to electrical signals 26. The electrical signals are fed to a computer 27 which processes them as desired. For example, the output 28 of the computer 27 can be fed to an oscilloscope, not shown in FIG. 3, to display the sampled points of the original waveform 10.

Alternatively, as shown in FIG. 4, typical light processing means 22" comprises optical signal processing devices such as an optical analog to digital converter 29 that converts the optical analog signals 20 to optical digital signals 30 which are fed to an optical computer 31 which processes them as desired. An optical analog to digital converter 29 is the subject matter of the copending United States patent application Ser. No. 786,770, filed Oct. 11, 1985, of Carl M. Verber for Optical A/D Conversion. Said application is assigned to the assignee of the present invention. Optical signal processing is sometimes advantageous for speed of signal processing compared to electrical signal processing.

According to the present invention, a plurality of electrooptical couplers 11 are located at intervals of length D along a stripline 12,12'. The continuous channel waveguide 14 is common to all electrooptic couplers 11. Therefore, a plurality of electrooptic couplers 11 are arranged along the stripline as in multiple sampling of a waveform. However, each electrooptic coupler 11 is activated sequentially as the light pulse 17 in the continuous channel waveguide 14 passes through each electrooptic coupler 11.

In sampling waveforms with high frequency components greater than about 10 GHz, there is spatial distortion of the waveform 10 or dispersion as it propagates along the stripline 12,12' in the direction 19. When the wavelength becomes comparable to the cross-sectional dimensions of the stripline, the wave velocity is no longer independent of frequencies. This phenomenon is known as the dispersive property of the stripline. The effective dielectric constant of the stripline. The effective dielectric constant of the stripline increases to higher values at higher frequencies. Typically, the increase occurs in the range of $10^{10}$ to $10^{12}$ hertz. The low-frequency components of the waveform travel faster than the high-frequency components of the waveform. The computer 27,31 of the light processing means 22 is programmed to compensate for the dispersion in the stripline 12,12' based on the dimensions of the stripline using a suitable formula (e.g., Yamashita et al, "An Approximate Dispersion Formula of Microstrip Lines for Computer-Aided Design of Microwave Integrated Circuits", IEEE Trans. Microwave Theory Tech., *MIT*-27(12), 1036-1038, 1979).

If two parallel channel waveguides are fabricated close together in such a way that their evanescent fields overlap, the optical signals will couple between the waveguides. The amount of light that couples between them is dependent on: (1) the distance between the waveguides, (2) the interaction length, and (3) the index of refraction of each of the waveguides and the substrate.

The first two parameters are determined during the design phase and are fixed once the coupler is fabricated. The index of refraction of the waveguides, on the other hand, can be adjusted using the electrooptic effect thereby making a voltage controlled optical coupler, referred to as an electrooptic coupler.

The coupling between waveguides can be described using the coupled wave equations $$\frac{dA_1}{dz} = j\frac{\Delta\beta}{2} A_1 - jKA_2 \quad (30)$$

$$\frac{dA_2}{dz} = -j\frac{\Delta\beta}{2} A_2 - jKA_1 \quad (31)$$

where $A_1$ and $A_2$ are the amplitudes of the optical fields in waveguides 1 and 2 respectively, $\Delta\beta$ is the difference in propagation constants, $(\beta_2 - \beta_1)$, of the waveguides, K is the coupling coefficient, and z is the direction of propagation. If all of the light is propagating in waveguide 1 at time t=0 then the power in each of the waveguides, after propagating the length of the interaction region L, is given by $$P_2 = A_2 A_2^* = \frac{\sin^2 KL \left[1 + \left(\frac{\Delta\beta}{2K}\right)^2\right]^{\frac{1}{2}}}{1 + \left(\frac{\Delta\beta^2}{2K}\right)} \quad (32)$$

$$P_1 = A_1 A_1^* = 1 - P_2 \quad (33)$$

assuming that the optical power is normalized to 1. The amount of coupling between waveguides can be controlled by adjusting the propagation constants of the waveguides using the electrooptic effect. The propagation constant is given by $$\beta = \frac{2\pi n}{\lambda} \quad (34)$$

where $\lambda$ is the freespace wavelength and n is the effective index of refraction in the waveguide. It was shown in the dissertation that the index of refraction could be changed by applying an electric field. From Equation 27

$$n = n_o - \frac{1}{2} n_o^3 rE \quad (35)$$

where E is the electric field and r is the appropriate electrooptic coefficient. Voltage applied to electrodes creates a field E~V/d. If the electrodes are oriented to obtain positive and negative fields, as shown in FIG. 2, then one index of refraction will increase and one will decrease.

As an example, consider the electrooptic coupler 11 propagating TM (Transverse Magnetic) polarized light 17, with a voltage on one of the electrodes 12. The voltage generates an electric field 25 which decreases the index of waveguide 14, and increases the index in waveguide 15.

$$n_1 = n_o + \frac{1}{2} n_o^3 r_{33} E_z \quad (36)$$

$$n_2 = n_o - \frac{1}{2} n_o^3 r_{33} E_z \quad (37)$$

where $r_{33}$ is the electrooptic coefficient for z-cut crystal with TM polarized light and an electric field in the z direction.

The propagation constants are then $$\beta_1 = \frac{2\pi n_1}{\lambda} = \frac{2\pi \left(n_o + \frac{1}{2} n_o^3 r_{33} E_z\right)}{\lambda} \quad (38)$$

$$\beta_2 = \frac{2\pi n_2}{\lambda} = \frac{2\pi \left(n_o - \frac{1}{2} n_o^3 r_{33} E_z\right)}{\lambda} \quad (39)$$

and the difference is given by $$\Delta\beta = \beta_1 - \beta_2 = \frac{2\pi n_o^3 r_{33} E_z}{\lambda} \quad (40)$$

Substituting Equation 40 back into Equations 32 and 33 gives the coupling power as a function of electric field.

SYMMETRIC COUPLING

FIG. 5 shows an example of the calculated coupling of light for a single electrooptic coupler 11 as a function of voltage. The dashed lines 40,41 show the relative light intensity versus voltage for a symmetric coupler for which the width of the channel waveguides 14,15 are equal (e.g. $w_1 = w_2 = 4$ micrometers). The coupled optical power ($P_2'$) 41 was calculated from Equation 32 and the optical power remaining in the main waveguide ($P_1'$) 40 was calculated from Equation 33.

ASYMMETRIC COUPLING

Looking at Equation 40 one sees that the sign E simply changes the sign of $\Delta\beta$. But, as Equation 32 and 33 show, the term is squared so its sign information is lost. This means that the coupling for an electric field +E is identical to the coupling for a field −E. Therefore, as shown in FIG. 5, the coupling power 41 is always symmetric about zero voltage. In a sampler this leads to two problems. The obvious one is that the sampler cannot distinguish between positive and negative voltages on the electrodes. Additionally, since the shape of the coupling curves are flat as the voltage goes through V=0, a small change in voltage will not change the amount of light that is coupled.

There are a number of ways to overcome these two problems. A bias voltage can be used to shift the coupling to a more linear region of the coupling curve. However, this method requires extra electrodes and, due to space limitations, is probably not practical for the sampler.

Another way to overcome the symmetric coupling problem is to fabricate the two waveguides with different widths. Increasing the width of the waveguides increases its effective index. Rewriting Equations 36 and 37

$$n_1 = n_{10} + \frac{1}{2} n_{10}^3 r_{33} E_z \quad (41)$$

$$n_2 = n_{20} - \frac{1}{2} n_{20}^3 r_{33} E_z \quad (42)$$

where $n_{10}$ and $n_{20}$ are the effective indices for waveguides 1 and 2 respectively. The propagation constants are then $$\beta_1 = \frac{2\pi n_1}{\lambda} = \frac{2\pi \left( n_{10} + \frac{1}{2} n_{10}^3 r_{33} E_z \right)}{\lambda} \quad (43)$$

$$\beta_2 = \frac{2\pi n_2}{\lambda} = \frac{2\pi \left( n_{20} - \frac{1}{2} n_{20}^3 r_{33} E_z \right)}{\lambda} \quad (44)$$

and the difference is given by $$\Delta\beta = \beta_1 - \beta_2 = \frac{2\pi}{\lambda} \left( n_{10} - n_{20} + \frac{1}{2}(n_{10}^3 + n_{20}^3) r_{33} E_z \right) \quad (45)$$

Again, substituting this equation back into the coupling equations gives the coupling power as a function of electric field. Now, however the coupling is not symmetric about zero.

An example of the coupling response of an asymmetric coupler is shown in FIG. 5 by the solid line. For example, if the width of the main channel waveguide 14 is $w_1 = 4$ micrometers and the coupler channel waveguide 15 has a width of $w_2 = 5$ micrometers, the calculated values of coupled optical power (P$_2$) 43 and (P$_1$) 42 as a function of voltage are as shown by the solid lines for an asymmetric coupler in FIG. 5. By increasing the width of one of the waveguides from 4 micrometers to 5 micrometers, the coupling curve 43 is shifted to the right and is no longer symmetric about zero volts. As shown in FIG. 5, the coupled optical power (P$_2$) for the asymmetric coupling curve 43 is essentially monotonic from abou $-5$ volts to $+5$ volts.

The asymmetric electooptic coupler clearly offers significant advantages over symmetric electrooptic couplers in this sampler application. First, a small change in voltage will significantly change the amount of coupling and thus will be easier to detect. Second, one can measure the difference between positive and negative voltage across the electrodes. For this reason, the asymmetric electrooptic couplers that will be described in the next few sections will be asymmetric.

For an electrooptic sampler as shown in FIG. 1 with a plurality of couplers 15, the amount of light coupled at each coupler 15 should be relatively small (e.g. 5 percent or less) depending on the number of couplers or samples required. As mentioned previously, the amount of light that couples between two parallel channel waveguides is dependent on: (1) the distance between waveguides (d) and (2) the interaction length (L). Table 1 shows some examples of the effect of varying d and L.

For example in Table 1, for L = 1 millimeter and d = 5 micrometers, the maximum coupled power is P$_2$ = 0.05. This example was used in FIG. 5 where it can be seen that the maximum coupled power (P$_2$) for the symmetric coupling curve 41 is P$_2'$ = 0.05 at zero volts. Similar considerations apply to the asymmetric coupler (i.e. the maximum of curve 43 in FIG. 5 is about P$_2$ = 0.05).

TABLE 1

| Interaction Length (L), mm | Calculated relative intensity of coupled light (P$_2$) normalized to the input light intensity (P = 1) | | | |
|---|---|---|---|---|
| | Distance Between Waveguides (d), micrometers | | | |
| | 2 | 3 | 4 | 5 |
| 2.25 | | 0.98 | 0.63 | 0.22 |
| 2.00 | | 0.98 | | |
| 1.50 | | 0.83 | | |
| 1.00 | 0.98 | 0.48 | 0.16 | 0.05 |
| 0.50 | | 0.14 | | |

In the dissertation it was shown that when two waveguides were placed in proximity so that their evanescent fields overlapped, the light would couple from one waveguide to the other. Furthermore, it was shown that if the waveguides were fabricated in an electrooptic material then the amount of coupling could be controlled via the electrooptic effect. This principle serves as a basis for the integrated-optic sampler.

The directional coupler can be used to sample an RF or microwave signal which is propagating along a stripline. It was hypothesized that when directional couplers, or electrooptic switches, were placed in series beneath a coplanar stripline, as shown in FIG. 1, the coupling between the two waveguides would be determined by the local voltage directly above the coupler. It was also hypothesized that a short pulse of light, traveling in a direction opposite to the RF signal, could pass sequentially through each of the electrooptic couplers causing a small amount of light to couple into the output waveguides. The amount of coupling would be dependent on the local electric fields and thus on the local voltages. Output detectors, which are placed at the ends of the output waveguide, could integrate the energy of the coupled optical pulses in the respective output waveguides in order to determine the associated instantaneous values of the electrical signal.

The sampler will require asymmetric couplers in which for example the output optical waveguide is slightly wider than the input optical waveguide. This provides a voltage-to-coupling curve 43 which is asymmetric about zero volts, as shown in FIG. 5. This enables the sampler to differentiate between positive and negative voltages. Furthermore, the couplers will be designed so that only a small percentage (<5%) of the light in the input optical waveguide will couple to the output waveguide. This will insure that there is enough light left in the main waveguide for the subsequent sample points.

THEORY OF OPERATION

This section will develop a set of equations that describe the output optical signals as a function of the input optical signal and the electrical signal. This will be done for a series of four cases. Cases 1 through 4 are illustrated schematically in FIGS. 6 through 9 respectively. FIG. 6 corresponds to FIG. 1 in which an optical pulse 17 traveling in a direction 18 from left to right in the main channel waveguide 14 is used to interrogate on electrical signal 10 of arbitrary waveform such as a transient electrical signal or a sine wave traveling in the opposite direction 19 from right to left in the traveling wave electrode 12. In FIGS. 7 and 8 the electrical signal 10' is a square pulse. In FIGS. 8 and 9 the optical signal 17' is an amplitude modulated optical signal. The first two cases, FIGS. 6 and 7, are examples of samplers in that the input optical signals are short pulses that interrogate electrical signals as they propagate down the traveling wave electrodes. This is the original objective of this work. The second two cases, FIGS. 8 and 9, are more general examples in that the optical signals are not pulses but instead amplitude modulated optical signals. This shows a more general application of this device. It will be shown that the electrooptic sampling device of this invention not only has the capability of sampling transient electrical signals but can also be used to sample intensity modulated optical signals. In this latter case the electrical signal would be a pulse which samples the unknown optical signal.

CASE 1

Sampler with Arbitrary Sine Wave Input

The first case considers a sampling device where a short optical pulse propagates down the input optical waveguide and a sine wave propagates down the traveling wave electrode. As with the traveling wave modulators described in the second chapter of the dissertation, the voltage signal is a function of position, x, and time, t. A sine wave was assumed as the electrical signal 10 to simplify the mathematical expression. If it is assumed that the voltage is a simple sine wave propagating from right to left, as shown in FIG. 1 or FIG. 6, then the traveling wave is given by $$v(x,t) = V_e \sin\left[\frac{2\pi}{T_e}\left(t + \frac{x}{v_e}\right) + \phi_o\right], \tag{64}$$

where $V_e$ is the amplitude, $T_e$ is the period, and $v_e$ is the velocity of the electrical signal, and $\phi_o$ is the relative phase shift at $t=0$.

The optical signal is assumed to arrive at the left side of the device at $t=t_o$ and propagate from left to right. A perfect optical pulse can be described by the pulse function $$A(x,t) = A_o p_{\frac{a}{2}}[x - tv_o + a/2], \tag{65}$$

where $p_D(x)$ is defined as the rectangular pulse function $$p_D(x) = U(x + D) - U(x - D) = \begin{cases} 0 : |x| > D \\ 1 : |x| < D \end{cases}, \tag{66}$$

a is the physical pulse width in meters, $A_o$ is the magnitude of the optical signal, and $v_o$ is the velocity of the optical signal.

In the dissertation it was shown that the amount of light that coupled between the two optical waveguides was dependent on the length of the interaction region, L, the distance between the waveguides, d, the wavelength of the optical signal, $\lambda$, the coupling coefficient, K, and the various indices of refraction, $n_1$, $n_2$, and $n_b$. It was also shown that the coupling could be described in terms of the difference in propagation constants of the two waveguides, $\Delta\beta$. Furthermore, it was shown that the propagation constant could be controlled via the electrooptic effect. It was shown also that as a photon propagated down the waveguide, it encountered a propagation constant that changed as a function of time and position. For the simple sine wave case, the voltage on the traveling wave electrode that a photon encounters is given by $$v(x,t_o) = V_e \sin\left[\frac{2\pi}{T_e}\left(t_o + \frac{x}{v_e} + \frac{x}{v_o}\right) + \phi_o\right], \tag{67}$$

where $t_o$ is the time that the photon enters the waveguide. Note that the sign of the term $x/v_o$ changed from Equation 58 of the second chapter due to the fact that the optical and electrical signals are now propagating in opposite directions.

The change in propagation constant was given in Equation 40 as $$\Delta\beta = \frac{2\pi n^3 r E}{\lambda}, \tag{68}$$

where n is the index of the optical waveguides, r is the appropriate electrooptic coefficient, and E is the electric field through the waveguide. The electric field produced by the electrodes is approximately $E=V/d$ where V is the voltage on the electrodes and d is the distance between the electrodes. The difference in propagation constants of the two waveguides as a function of time and position is given by $$\Delta\beta(x,t_o) = \frac{2\pi n^3 r V_o}{\lambda d} \sin\left[\frac{2\pi}{T_e}\left(t_o + \frac{x}{v_e} + \frac{x}{v_o}\right) + \phi_o\right], \tag{69}$$

Since the propagation constant changes as a function of position and time, the coupling equations cannot be solved analytically. However, as described in the second chapter, an average propagation constant can be calculated by integrating $\Delta\beta$ over the interaction length, L. The average value of $\Delta\beta$ that a propagating optical signal encounters is given by $$\overline{\Delta\beta}(t_o) = \frac{1}{L} \int_0^L \Delta\beta(x,t_o)dx. \tag{70}$$

Substituting Equation 69 into 70 gives $$\overline{\Delta\beta}(t_o) = \frac{2\pi n^3 r V_o}{L\lambda d} \int_0^L \sin\left[\frac{2\pi}{T_e}\left(t_o + \frac{x}{v_e} + \frac{x}{v_o}\right) + \phi_o\right]dx. \tag{71}$$

After performing the integration, this becomes $$\overline{\Delta\beta}(t_o) = \tag{72}$$

$$\frac{-2\pi n^3 r V_o}{L\lambda d} \frac{T_e v_{eq}}{2\pi} \left[\cos\left[\frac{2\pi}{T_e}\left(t_o + \frac{L}{v_{eq}}\right) + \phi_o\right] - \cos\left[\frac{2\pi}{T_e}t_o + \phi_o\right]\right],$$

where $$v_{eq} = \frac{v_e v_o}{v_e + v_o}. \tag{73}$$

Using trigonometric identities to combines the terms with $t_o$ yields $$\overline{\Delta\beta(t_o)} = \tag{74}$$

$$\frac{\beta_o}{L} \frac{T_e}{2\pi} v_{eq} \sin\frac{\pi L}{T_e v_{eq}} \sin\left[\frac{2\pi t_o}{T_e} + \frac{\pi L}{T_e v_{eq}} + \phi_o\right],$$

where $$\beta_o = \frac{2\pi n^3 r V_o}{\lambda d}. \tag{75}$$

This again is the average difference in propagation constant encountered by a photon during its propagation down the first coupler. The variable $t_o$ is the time the photon enters the main channel waveguide. To determine the optical intensity out of the first output waveguide one must substitute Equation 74 into the solutions to the coupling equations given in Equations 32 and 33 in the second chapter. However, in this case the input optical power cannot be arbitrarily normalized to 1 since the optical signal is now a pulse function. The optical intensity from the first output waveguide is given by:

$$P_{12}(t_o) = AA^*(t_o) \frac{\sin^2\left[KL\left[1 + \left[\frac{\overline{\Delta\beta(t_o)}}{2K}\right]^2\right]^{\frac{1}{2}}\right]}{1 + \left[\frac{\overline{\Delta\beta(t_o)}}{2K}\right]^2}, \tag{76}$$

where again K is the coupling coefficient and L is the interaction length.

Under the assumption of a lossless optical waveguide, the intensity of light remaining in the main optical waveguide after the first coupler is simply the initial input light minus the light out of the first coupler. In other words $$P_{11}(t_o) = AA^*(t_o) - P_{12}(t_o). \tag{77}$$

For these equations, the first subscript refers to the coupler number and the second subscript refers to the main (1) or output (2) waveguides. It is important to note that these two output powers are given as functions of time, $t_o$, which is again the time the light enters the main channel waveguide. Therefore, as time changes, i.e. the electrical and optical signals move, the amount of light that couples into the output waveguides changes. However, the optical signal doesn't arrive at the detector until it has had a chance to propagate down the output optical waveguide. Therefore, assuming a lossless optical waveguide and an ideal optical detector, the actual detected signal would be a delayed version of Equations 76 and 77.

In these derivations the equations are all referenced to the time that the photon initially enters the main optical waveguide, $t_o$. The optical power was described in Equation 65 as a function of time and position. However the photon enters the waveguide at x=0. Therefore, the equation for the optical power that must be used in the Equations 76 and 77 is given by:

$$AA^*(t_o) = |A_o|^2 p_{\frac{a}{2}}[a/2 - t_o]. \tag{78}$$

This can be substituted into Equations 76 and 77 to give expressions for the power out of the first optical coupler.

The amount of light that is coupled at the second coupler is determined in a similar fashion. The limits of integration, however, must be changed when averaging $\Delta\beta$. For the second coupler the average $\Delta\beta$ becomes $$\overline{\Delta\beta_2(t_o)} = \frac{1}{L}\int_D^{D+L} \Delta\beta(x, t_o)dx, \tag{79}$$

where x=D is the spacing of couplers as shown in FIG. 1. For a pure sinusoidal signal this becomes $$\overline{\Delta\beta_2(t_o)} = \frac{\beta_o}{L} \frac{T_e v_{eq}}{2\pi} \sin\left[\frac{2\pi t_o}{T_e} \frac{2\pi D}{T_e v_{eq}} + \frac{\pi L}{T_e v_{eq}} + \phi_o\right]\sin\frac{\pi L}{T_e v_{eq}}. \tag{80}$$

For D=0 this equation reduces to Equation 74.

Another major consideration in deriving a function for the coupled light is the amount of light available for coupling at a given coupler. In the first coupler it was assumed that the light in the input waveguide was a ideal pulse with amplitude $A_o$. However, since the first coupler couples some of the light out of the input waveguide, there is less entering coupler 2 than was entering coupler 1. Therefore, the expression for the amount of light that couples out of the second coupler is dependent on how much light is available after the first waveguide. This is given by $$P_{22}(t_o) = P_{11}(t_o) \frac{\sin^2\left[KL\left[1 + \left[\frac{\overline{\Delta\beta_2(t_o)}}{2K}\right]^2\right]^{\frac{1}{2}}\right]}{1 + \left[\frac{\overline{\Delta\beta_2(t_o)}}{2K}\right]^2}, \tag{81}$$

and the amount of light remaining after the second coupler is given by $$P_{21}(t_o) = P_{11}(t_o) - P_{22}(t_o). \tag{82}$$

Similar equations can be derived for the remaining couplers in the sampler.

FIG. 26 is the dissertation shows an example of the integrated optic sampler. In this example the electrical signal is a sine wave with a 2 volt amplitude and a period of 600 picoseconds (1.67 GHz). The optical pulse is 15 picoseconds in duration with a normalized intensity of 1. The top graph shows the values of the voltage and optical signals at t=0. The sampler consists of three couplers each placed 10 millimeters apart. The output consists of three optical pulses that represent the light out of each of the couplers. The delay due to the optical propagation down the output waveguides has been neglected. The three pulses are simply delayed by the propagation time of the input pulse down the main optical waveguide. The output voltage symbols (x) represent the voltage samples. They are calculated using the DC characteristics of the coupler which are stored in a look-up table. The calculations take into consideration not only the non-linearity of the voltageto-coupling curve but also the fact that some of the light is removed from the main waveguide at each coupler.

Note in these examples the sampler cannot distinguish between positive and negative voltage. This is due to the fact that the couplers used in the sampler were symmetric couplers where both the main optical waveguide and the output optical waveguide have equal width and refractive indices. Another consideration in deriving the equations for output power is the effect of asymmetric couplers on the sampler. It was shown in Chapter 2 of the dissertation that if a coupler was fabricated with asymmetric waveguides, (in other words, waveguides with different indices), then the coupling curve 43 could be made to be asymmetric about zero, as shown back in FIG. 5. The difference in propagation constants for the two waveguides was given in Equation 45 as $$\Delta\beta = \beta_1 - \beta_2 = \frac{2\pi}{\lambda} [n_{10} - n_{20} + \frac{1}{2}(n_{10}^3 + n_{20}^3) r_{33} E_z], \tag{83}$$

where $n_{10}$ is the effective index in the main channel and $n_{20}$ is the effective index in the output waveguide. This equation can be used instead of Equation 68 in deriving the asymmetric version of the average $\Delta\beta$, which can then be substituted into Equations 76 and 77 to determine the output optical signals.

FIG. 27 in the dissertation shows the output signals of that sampler with asymmetric couplers. Note that under this condition the sampler can distinguish between positive and negative voltages.

CASE 2

Sampler with Electrical Pulse Input

The second case, FIG. 7, is also considered a sampling example since, again, the optical signal is a square pulse. The electrical signal in this case is also a square pulse, which will demonstrate the device's capability of sampling transient electrical signals. The electrical signal can be represented by the pulse function $$v(x,t) = V_e \, p_{\frac{b}{2}} [tv_e + x - x_e], \tag{84}$$

where $V_e$ is the amplitude, b is the physical length of the electrical pulse in meters, and $x_e$ corresponds to the physical position of the electrical pulse when the optical pulse arrives at the device, as shown in FIG. 28 in the dissertation.

As in case 1, the optical pulse is assumed to arrive at the left side of the device at $t=t_o$ and propagate from left to right. The optical pulse can be described by the pulse function $$A(x,t) = A_o \, p_{\frac{a}{2}} [x - tv_o + a/2], \tag{85}$$

where again $A_o$ is the amplitude of the optical signal, $v_o$ is the velocity of the optical pulse in the waveguide, and a is the physical length of the pulse in meters.

Assuming that the electrical signal is a square pulse, a photon that propagates down the waveguide encounters one of two possible voltages, 0 or $V_o$, and therefore one of two propagation constants. For a symmetric coupler, the difference in propagation constant at any instant in time is either given by $$\Delta\beta = 0, \tag{86}$$

for v=0, or $$\Delta\beta = \frac{2\pi n^3 r V_o}{\lambda d}, \tag{87}$$

for $v=V_o$.

In order to determine the amount of light in the output waveguides, one must calculate the average $\Delta\beta$ that a photon experiences as it propagates down the main optical channel. This again can be approximated by integrating the $\Delta\beta$ over the interaction length, L. For the first coupler $$\overline{\Delta\beta_1}(t) = \frac{1}{L} \beta_o \int_0^L p_{\frac{b}{2}} [tv_e + x + x_e] dx. \tag{88}$$

where $\beta_o$ is given in Equation 75. Similarly, for the second coupler $$\overline{\Delta\beta_2}(t) = \frac{1}{L} \beta_o \int_D^{D+L} p_{\frac{b}{2}} [tv_e + x + x_e] dx. \tag{89}$$

Using the discussion for chapter 2 of the dissertation, one can show that for an asymmetric coupler these average $\Delta\beta$ are given by $$\overline{\Delta\beta_1}(t) = \frac{2\pi}{\lambda} (n_{10} - n_{20}) + \tag{90}$$

$$\frac{\pi}{\lambda} (n_{10}^3 + n_{20}^3) r \frac{V_o}{Ld} \int_0^L p_{\frac{b}{2}} [tv_e + x + x_e] dx,$$

and $$\overline{\Delta\beta_2}(t) = \frac{2\pi}{\lambda} (n_{10} - n_{20}) + \tag{91}$$

$$\frac{\pi}{\lambda} (n_{10}^3 + n_{20}^3) r \frac{V_o}{Ld} \int_L^{D+L} p_{\frac{b}{2}} [tv_e + x + x_e] dx.$$

Substituting these equations into the solution of the coupling equations gives an expression for the optical intensities out of the couplers. The light out of the first coupler is given by $$P_{12}(t) = |A_o|^2 p_{\frac{a}{2}} \left[ x_o - tv_o + \frac{a}{2} \right] \frac{\sin^2\left[ KL \left[ 1 + \left[ \frac{\overline{\Delta\beta_1}(t_o)}{2K} \right]^2 \right]^{\frac{1}{2}} \right]}{1 + \left[ \frac{\overline{\Delta\beta_1}(t_o)}{2K} \right]^2}. \tag{92}$$

The light remaining in the main channel waveguide after the first coupler is given by $$P_{11}(t_o) = |A_o|^2 p_{\frac{a}{2}} [x - tv_o + a/2] - P_{12}(t_o). \tag{93}$$

The light out of the second coupler is given by $$P_{22}(t_o) = P_{11}(t_o) \frac{\sin^2\left[KL\left[1 + \left[\frac{\Delta\beta_2(t_o)}{2K}\right]^2\right]^{\frac{1}{2}}\right]}{1 + \left[\frac{\Delta\beta_2(t_o)}{2K}\right]^2}. \tag{94}$$

The light remaining in the main channel after the second coupler is given by $$P_{21}(t_o) = P_{11}(t_o) - P_{22}(t_o). \tag{95}$$

FIG. 29 in the dissertation shows some examples of the input and output signals.

CASE 3
Intensity Modulated Optical Signal and a Square Electrical Pulse In this third case, FIG. 8, the optical signal is an intensity modulated signal and the electrical signal is a short pulse, as shown in FIG. 30 in the dissertation. This is an example of a sampler that samples optical signals with an electrical pulse. In this case the optical signal is represented by an intensity modulated signal given by $$A(x,t) = A_o [1 + f(x,t)]^{\frac{1}{2}} e^{j\omega_o t}, \tag{96}$$

where $A_o$ is the magnitude, $\omega_o$ is the optical frequency and f(t) is the modulation function. If the modulation function is given by a simple sine wave with 100% modulation, then the amplitude is given by $$A(x,t) = A_o \left[1 + \sin\left[\frac{2\pi}{T_o}\left(t + \frac{x}{v_o}\right) + \phi\right]\right]^{\frac{1}{2}} e^{j\omega_o t}, \tag{97}$$

where $T_o$ is the period of the modulation function, $v_o$ is the optical velocity, and $\phi$ is the relative phase of the modulation. Everything can again be referenced to the time that the photon enters the waveguide, $t_o$. The optical signal can then be given as only a function of time $t_o$ since, by definition, x=0 at t=$t_o$. The intensity of the optical signal into the main waveguide is then given by $$A(t_o)A^*(t_o) = A_o^2 \left[1 + \sin\left[\frac{2\pi}{T_o} t_o + \phi\right]\right]^{\frac{1}{2}}. \tag{98}$$

Another consideration is how much of the light will be coupled into the output waveguides. Since the electrical signal is a pulse function the discussion from Case 2 applies and the average $\Delta\beta$ is given by $$\Delta\beta_1(t) = \frac{2\pi}{\lambda}(n_{10} - n_{20}) + \tag{99}$$

$$\frac{\pi}{\lambda}(n_{10}^3 + n_{20}^3)r\frac{V_o}{Ld}\int_o^L p_{\frac{b}{2}}[tv_e + x + x_e]dx.$$

Substituting this into the solution of the coupling equations, along with Equation 98 gives $$P_{12}(t) = |A_o|^2 \left[1 + \sin\left(\frac{2\pi}{T_e} t + \tag{100}\right.\right.$$

$$\left.\left.\phi\right)\right] \frac{\sin^2\left[KL\left[1 + \left[\frac{\overline{\Delta\beta_1(t_o)}}{2K}\right]^2\right]^{\frac{1}{2}}\right]}{1 + \left[\frac{\overline{\Delta\beta_1(t_o)}}{2K}\right]^2},$$

and $$P_{11}(t) = |A_o|^2 \left[1 + \sin\left(\frac{2\pi}{T_e} t + \phi\right)\right] - P_{12}(t). \tag{101}$$

For the second coupler the difference in propagation constant is given by $$\Delta\beta_2(t_o) = \frac{2\pi}{\lambda}(n_{10} - n_{20}) + \tag{102}$$

$$\frac{\pi}{\lambda}(n_{10}^3 + n_{20}^3)r\frac{V_o}{Ld}\int_D^{D+L} p_{\frac{b}{2}}[t_o v_e + x - x_e]dx.$$

The power coupled out of the second coupler is given by $$P_{22}(t_o) = P_{11}(t_o) \frac{\sin^2\left[KL\left[1 + \left[\frac{\overline{\Delta\beta_2(t_o)}}{2K}\right]^2\right]^{\frac{1}{2}}\right]}{1 + \left[\frac{\overline{\Delta\beta_2(t_o)}}{2K}\right]^2}, \tag{103}$$

and the light remaining in the main waveguide after the second coupler is given by $$P_{21}(t_o) = P_{11}(t_o) - P_{22}(t_o). \tag{104}$$

FIG. 31 in the dissertation shows some examples of this case.

CASE 4
Arbitrary Optical and Electrical Signals

The fourth case, FIG. 9, is the most general case. It assumes an arbitrary electrical signal on the traveling wave electrode and an arbitrary intensity modulated optical signal in the main optical waveguide, as shown in FIG. 32 in the dissertation.

The main electrical signal traveling on the electrode structure can be described as $$v(x,t) = V_o g(x,t), \tag{105}$$

where $V_o$ is the amplitude and g(x,t) is the arbitrary function of time t and position x. The optical signal can be described as $$A(x, t) = A_o[1 + f(x, t)]^{\frac{1}{2}} e^{j\omega_o t}, \tag{106}$$

where $A_o$ is the amplitude and f(x,t) is an arbitrary modulation function. If the equations are again referenced back to when the photons enter the waveguide, then the intensity is given by $$A(t_o)A^*(t_o) = |A_o|^2(1 + f(t_o)). \tag{107}$$

For this general case the average difference in propagation constant through the first coupler is given by $$\overline{\Delta\beta_1}(t_o) = \frac{2\pi}{\lambda}(n_{10} - n_{20}) + \frac{\pi}{\lambda}(n_{10}^3 + n_{20}^3)r\frac{V_o}{Ld}\int_0^L g(x, t_o)dx. \quad (108)$$

The optical signal out of the first optical coupler is given by $$P_{12}(t_o) = |A_o|^2[1 + f(t_o)]\frac{\sin^2\left[KL\left[1 + \left[\frac{\overline{\Delta\beta_1}(t_o)}{2K}\right]^2\right]^{\frac{1}{2}}\right]}{1 + \left[\frac{\overline{\Delta\beta_1}(t_o)}{2K}\right]^2}. \quad (109)$$

The optical signal remaining in the main optical waveguide after the first coupler is given by $$P_{11}(t_o) = |A_o|^2[1+f(t_o)] - P_{12}(t_o). \quad (110)$$

The average difference in propagation constant through the second coupler is given by $$\Delta\beta_2(t_o) = \quad (111)$$

$$\frac{2\pi}{\lambda}(n_{10} - n_{20}) + \frac{\pi}{\lambda}(n_{10}^3 + n_{20}^3)r\frac{V_o}{Ld}\int_L^{D+L} g(x, t)dx.$$

The optical signal out of the second optical coupler is given by $$P_{22}(t_o) = P_{11}^2(t_o)\frac{\sin^2\left[KL\left[1 + \left[\frac{\overline{\Delta\beta_2}(t_o)}{2K}\right]^2\right]^{\frac{1}{2}}\right]}{1 + \left[\frac{\overline{\Delta\beta_2}(t_o)}{2K}\right]^2}. \quad (112)$$

The optical signal remaining in the main optical waveguide after the second coupler is given by $$P_{21}(t_o) = P_{11}(t_o) - P_{22}(t_o). \quad (113)$$

FIG. 33 in the dissertation shows some examples of the sampler with arbitrary electrical and optical signals. In this example the couplers have been designed to couple all of the light when the voltage is about 2 volts and none of the light when the voltage is −2 volts. Since the intensity is sinusoidally modulated at a frequency identical to the voltage waveform, the output of the first coupler is maximum when the two waveforms are in phase physically at a precise instant in time. The two waveforms cannot really be in phase since they are propagating in the opposite directions. However, if the voltage on the electrodes of the first coupler is +2 volts at the same time that the intensity of the optical signal is high, then all of light couples to the output waveguide. If the velocity of the optical signal is equal to the velocity of the electrical signal, then the maximum signals will continue to occur simultaneously at a period equal to the period of the optical and electrical signals. FIG. 33c in the dissertation demonstrates that for this example the intensity of the second coupler is maximum if the two signals are 180 degrees out of phase. The reason for this is that the maximum signals occur at the second coupler. This demonstrates an interesting application of the integrated-optic sampler.

SAMPLING RATE AND APERTURE

Two parameters of interest in a sampler are the rate at which the electrical signal is sampled and the aperture, or the duration of the sample. The sampling rate can be determined by the velocity of both the optical pulse and the RF signal, and the distance between the electrooptic couplers. To show this consider the example shown back in FIG. 25 in the dissertation. If the electrical signal propagates at a velocity $v_e$ and the optical signal propagates at a velocity $v_o$ and the distance between the couplers is D, then the sampling rate is given by $$f_s = \frac{|v_{eq}|}{D} \quad (114)$$

In an ideal sampler, as shown in FIG. 12, the sampling function 50 consists of a series of impulses 51 which generate instantaneous sample points 52 of the waveform 53. In the integrated optic sampler, as with all realistic samplers, the sampling function consists of a series of pulses with finite aperture.

The aperture of the sampler, which is the length of time that the sampler is "looking" at the signal, is dependent on the interaction length of the two waveguides (i.e. the length of the coupler), the duration of the optical pulse, and the velocities of the the optical and electrical signals.

As an example, consider an electrooptic coupler that has an interaction region that is L meters in length, and an optical pulse that is τ seconds in duration and is propagating at a velocity of $v_o$ meters per second while the electrical signal is traveling at a velocity of $v_e$ meters per second. Throughout this work it has been assumed that the amount of coupling between the input and output waveguides was determined by the average propagation constant that a photon, or group of photons, experienced as they propagated along the coupler. With this in mind, the sampling function can be determined by considering how long the photons remain in the interaction region and how far the electrical signal propagates during that time. The length of time that a photon remains in the waveguide is given by $$t_1 = \frac{L}{v_o}, \quad (115)$$

where L is the interaction length and $v_o$ is the velocity of the optical signal. During that time the electrical signal propagates a distance $$L_1 = v_e t_1, \quad (116)$$

where $v_e$ is the velocity of the electrical signal. The total length of electrical signal that the photon sees is given by the sum $$L_{pho} = L + L_1, \quad (117)$$

which can be rewritten as $$L_{pho} = L\left(1 + \frac{v_e}{v_o}\right). \tag{118}$$

Since the electrical signal is propagating at a velocity, $v_e$, the time aperture of a single photon is given by $$t_{pho} = \frac{L_{pho}}{v_e} = \frac{L}{v_e}\left[1 + \frac{v_e}{v_o}\right], \tag{119}$$

which can be rewritten as, $$t_{pho} = L\left[\frac{v_e + v_o}{v_e v_o}\right]. \tag{120}$$

The optical pulse, which is a collection of photons, is $\tau$ seconds in duration. Therefore, the total aperture of the sample pulse is given by $$t_{tot} = \tau + t_{pho}. \tag{121}$$

Substituting in Equation 120 gives $$t_{tot} = \tau + L\left[\frac{v_e + v_o}{v_e v_o}\right]. \tag{122}$$

Note that the aperture of the sampler can be reduced by (1) reducing the optical pulse width, (2) reducing the interaction region of the coupler, or (3) increasing either the electrical or optical velocity, i.e. changing the dielectric constant or the index of refraction of the integrated optic device.

The finite aperture of the sampler tends to distort the spectrum of the sampled signal by what is known as the aperture effect[1]. However, most or all of the distortion from the aperture effect can be removed using equalization or signal processing.

ELECTRONICS CONSIDERATIONS

The two electrical components that will have a significant impact on the sampler's speed and sensitivity are the laser diode and the optical detector. The laser diode is required to produce the short optical pulse which indirectly determines the aperture of the sampler. The optical detector must determine how much optical energy is coupled to the output waveguide and is therefore a major contributor to the sampler's sensitivity.

The short optical pulse can be generated by direct modulation or through an external modulator. A laser diode can be used to generate a short optical pulse by biasing the laser just below threshold and using a current pulse to push the laser into its lasing region. One problem with direct modulation is that it is hard to maintain single mode operation of the laser diode. Researchers at NTT in Japan have shown that gigabit-rate optical pulses can be generated with a single longitudinal mode by means of harmonic frequency sinusoidal injection current modulation, where the modulation frequency is twice as high as the pulse frequency[2]. They have demonstrated the modulation of a laser diode with 200 picosecond pulses at a 1.5 GHz repetition rate.

Researchers at Bell Laboratories[3] have used direct modulation of injection current to generate optical pulses that are 42 picoseconds in duration at a repetition rate of 500 MHz. The technique uses a comb generator to generate large electrical pulses 50 picoseconds in duration and 25 Volts in amplitude. The electrical pulses are fed through a bias tee so that the laser diode can be biased just below threshold. Their experiment results again verify that the pulses required for this sampler are obtainable through direct modulation.

One can also consider generating the optical pulses through external modulation using a CW diode laser. One such device is a directional coupler similar to that considered for the sampler. Marcatili of Bell Laboratories showed that a directional coupler with traveling wave electrodes could be used to generate optical pulses from a CW laser source[4]. In his device the directional coupler was designed so that all of the light would couple to the output waveguide only if the voltage on the electrodes was zero. The traveling wave electrical signal was a simple sine wave which propagated on the electrodes at a velocity equal to the velocity of the optical signal propagating in the channel waveguides. Since the velocities were both equal and in the same direction, any photon or group of photons which entered the waveguide coupler would see essentially a constant voltage throughout the propagation down the waveguide. Any photon that entered the waveguide when the voltage was zero would couple totally to the output waveguide. If a large amplitude sine wave is used, then it is predicted that sub-picosecond pulses can be generated.

The optical detector will most likely be the component that limits the sensitivity of the sampler. There is always a tradeoff between response time and sensitivity. Devices that have fast rise times, like PIN photodiodes, are usually not very sensitive. Detecting devices that are sensitive, such as Avalanche Photodiodes, APD, have slower response times.

The conventional photodiode circuit, shown in FIG. 10 consists of a photodetector 33 connected to a load resistor R 35 and an amplifier 36 with gain G. The light 20 received by the photodiode produces a current ($i_L$) 34 in the load resistor 35. The magnitude of the current for a given incident optical power is defined in terms of the responsivity in units of amperes per watt. A typical responsivity for a silicon PIN photodiode is about 0.5 amperes per watt at 0.84 microns. In other words, for every watt of incident optical power, the photodiode will produce 0.5 amperes of current. Obviously there is a point at which the photodiode saturates. This is typically between 10 and 100 mW of incident power for a PIN photodiode.

An alternate way to describe this relationship is the quantum efficiency, $\eta$, which is by definition the ratio of the photo-generated current $i_L$ to the incident optical flux in photons per second. This makes the quantum efficiency a unitless parameter with a value less than unity.

Another important parameter in selecting the detector is the dark current, $I_d$, which is the current that flows even without incident radiation. The dark current tends to increase with temperature, and is usually large for devices with a large active area.

The signal-to-noise ratio for a simple optical detector is given by:

$$\frac{S}{N} = \tag{123}$$

-continued $$\frac{2\left[\frac{\eta e}{hf} PM\right]^2}{\left[\left[3e\left[\frac{\eta e}{hf}(P+P_b)\right]+2I_{de}\right]M^n + \frac{4kTF}{R}\right]B},$$

where

P=incident optical (mean) power on the photodiode
η=quantum efficiency
h=Planck's constant
f=optical frequency
$I_d$=dark current
M=avalanche gain
k=Boltzmann's constant
R=effective load resistance
B=bandwidth
$P_b$=background optical power (unwanted)
n=noise factor for avalanche multiplication
F=noise figure of amplifier There are two terms in the denominator that represent sources of noise. The first represents shot noise which is associated with the random generation of carriers. The term depends on the incident optical power, P, the unwanted optical power, $P_B$, and the dark current, $I_d$. The second term represents thermal noise generated by the output load resistor.

The load resistor 35 of the detector is often made to be large in order to reduce the effect of thermal noise and operate in what is referred to as shot-noise limited detection. However, when the load resistor becomes large, the RC time constant of the load resistor 35 and the junction capacitance of the photodiode 33 will severely limit the bandwidth of the detector.

The parameter M in Equation 123 is the avalanche gain of the detector 33. For PIN photodiodes M=1. However, an avalanche photodiode, APD, can offer values of M between 10 and 100. An APD operates with large reverse bias 32 which accelerates the carriers across the depletion region of the PN junction with enough energy to force new electrons from the valence band to the conduction band[5]. The multiplication factor increases the current by M and therefore the signal power by $M^2$ over the ordinary photodiode. However, the shot noise is increased by $M^n$ where $2<n<3$[176]. At high multiplication rates, the shot noise has been observed to be proportional to $M^{2.1}$.

Typical parameters for commercially available photodetectors is shown in Table 2. FIG. 36 in the dissertation graphically shows the relationship between bandwidth and the minimum detectable signal (S/N=1) for these two detectors.

TABLE 2

TYPICAL PARAMETERS FOR COMMERCIAL PHOTODIODES

| Manufacturer | Ortel | Mitsubishi |
|---|---|---|
| Part | PD050 | PD1302 |
| Type | PIN | APD |
| Quantum Efficiency (λ = .84) | .65 | .77 |
| Avalanche Gain | 1 | 100 |
| Avalanche Noise Factor | 0 | 2.25 |
| Dark Current (nA) | .2 | .3 |
| Capacitance (pf) | .5 | 1.5 |
| Bandwidth (GHz) | 7 | 2 |

INTEGRATING DETECTOR

It is clear from FIG. 36 in the dissertation that a relatively large amount of optical power will be required to operate the detector at high frequencies (>GHz). However, it isn't important that the detector reproduce the received optical pulse. Instead, it is only important that the detector has the capability of determining the total energy of the optical pulse.

An integrating optical detector may have the capability of measuring the total power at a bandwidth that is significantly reduced over the typical optical detector. One circuit for an integrating optical detector is shown schematically in FIG. 11. The photodetector 33 is reverse biased 32 between $V_{bias}$ and the virtual ground at the input of the operational amplifier 39. The output 46 of the ideal integrator is given by $$V_{out} = -\frac{1}{C} \int i\, dt. \tag{124}$$

With the proper selection of a low bias current operation amplifier 39 and capacitor 44, this circuit can measure the energy in extremely small optical pulses 20.

The signal power generated at the photodiode 33 is proportional to the mean square value of the current[7] 38 which is given by $$\overline{i_s^2} = 2\left[\frac{Pe\eta M}{hf}\right]^2, \tag{125}$$

where P is the incident optical power, η is the quantum efficiency, M is the avalanche gain, if applicable, f is the optical frequency, and h is Planck's constant. The two sources of noise, as described earlier in this section, are shot noise and thermal noise. The shot noise term is given by:

$$\overline{i_{n1}^2} = \frac{3e^2(P+P_b)\eta BM^n}{hf} + 2eI_d BM^n, \tag{126}$$

where $P_b$ is the undesired background optical signal, B is the bandwidth, $I_d$ is the dark current, and n is a noise factor associated with the avalanche process. The thermal noise term is given by $$\overline{i_{n2}^2} = \frac{4ktFB}{R}, \tag{127}$$

where R is the load resistance, T is the temperature and F is the noise figure of the amplifier.

An ideal integration supplies an output voltage that is the integral of the input current, assuming that the operation amplifier has infinite open-loop gain[8]. In a realistic operational amplifier the open loop gain is finite, $A_{vo}$, and there is a dominant pole at some frequency $f_1$, as shown in FIG. 38 in the dissertation. The voltage gain for a realistic operational amplifier is then given by $$A_v = \frac{A_{vo}}{1 + \frac{S}{2\pi f_1}}. \tag{128}$$

The capacitor will add a pole at $$f_2 = \frac{1}{2\pi RC |A_{vo}|}, \quad (129)$$

where R is the source resistance in combination with the internal resistances of the operational amplifier. The source resistance for the detector is very large. This is why it is usually modeled as a current source. The pole due to the capacitor is therefore at a very low frequency.

Since both the shot noise and thermal noise processes can be considered white noise sources, particularly in the frequency range of the integrator, a noise bandwidth can be defined for the integrator where the noise bandwidth is the bandwidth of an ideal rectangular filter that passes the same amount of noise power as the real filter. It can be shown that the noise bandwidth for a simple RC low pass filter is[9]

$$B_N = \frac{\pi}{2} f_c, \quad (130)$$

where $f_c$ is the 3 dB bandwidth of the low pass filter. The noise bandwidth for the integrator is then $$B_N = \frac{1}{4RC |A_{vo}|}. \quad (131)$$

This can be substituted into the equation for the noise.

Now the signal to noise of the detection system of FIG. 11 can be estimated. Assume that the optical pulse 20 propagating to the detector 33 is a perfect pulse with peak power $P_o$ and duration $\tau$. Also assume that the integrator is reset by switch 45 every $t_1$ seconds. This reset time could correspond to the repetition frequency of the laser diode. The RMS current from the detector 33 produced by the received optical pulse is given by $$\overline{i_s} = \frac{1.414 \, P_o e \eta M}{hf} p_{\frac{\tau}{2}}(t - t_2), \quad (132)$$

where $t_2$ is the time the pulse arrives at the detector. The integrator produces a signal voltage 46 given by $$v_{sig} = \frac{1}{C} \int_o^{t_1} \frac{1.414 \, P_o e \eta M}{hf} p_{\frac{\tau}{2}}(t - t_2) dt. \quad (133)$$

If the pulse arrives before the integration time $t_1$, the integral is simply $$v_{sig} = \frac{1}{C} \frac{1.414 \, P_o e \eta M \tau}{hf}. \quad (134)$$

The signal power is proportional to the mean square voltage, which is given by $$V_{sig}^2 = 2 \left[ \frac{P_o \eta e M \tau}{Chf} \right]^2. \quad (135)$$

From Equation 125 and 126 the RMS noise current is given by $$\overline{i_n} = \left[ \frac{3e^2(P + P_b)\eta BM^n}{hf} + 2eI_d BM^n + \frac{4kTFB}{R} \right]^{\frac{1}{2}}. \quad (136)$$

The integrated noise voltage is given by $$\overline{v_n} = \frac{1}{C} \int_o^{t_1} \left[ \frac{3e^2(P + P_b)\eta BM^n}{hf} + 2ei_d BM^n + \frac{4kTFB}{R} \right]^{\frac{1}{2}} dt. \quad (137)$$

The only term that depends on time is the input power P, which is equal to zero except when the optical pulse is present. The integral can be broken into two parts. The first term is integrated over the time that the pulse is present. The second term is integrated over the rest of the repetition time $t_1$. The integral is given by $$\overline{v_n} = \quad (138)$$

$$\frac{1}{C} \int_o^{\tau} \left[ \frac{3e^2(P + P_b)\eta BM^n}{hf} + 2ei_d BM^n + \frac{4kTFB}{R} \right]^{\frac{1}{2}} dt +$$

$$\frac{1}{C} \int_\tau^{t_1} \left[ \frac{3e^2(P_b)\eta BM^n}{hf} + 2ei_d BM^n + \frac{4kTFB}{R} \right]^{\frac{1}{2}} dt.$$

The bracketed terms are now constant. The integrals are given by $$\overline{v_n} = \frac{\tau}{C} \left[ \frac{3e^2(P + P_b)\eta BM^n}{hf} + 2ei_d BM^n + \frac{4kTFB}{R} \right]^{\frac{1}{2}} + \quad (139)$$

$$\frac{(t_1 - \tau)}{C} \left[ \frac{3e^2(P_b)\eta BM^n}{hf} + 2ei_d BM^n + \frac{4kTFB}{R} \right]^{\frac{1}{2}}.$$

The noise power is again proportional to the mean square voltage $$\overline{v_n^2} = \left[ \frac{\tau}{C} \left[ \frac{3e^2(P + P_b)\eta BM^n}{hf} + 2ei_d BM^n + \frac{4kTFB}{R} \right]^{\frac{1}{2}} + \quad (140)$$

$$\frac{(t_1 - \tau)}{C} \left[ \frac{3e^2(P_b)\eta BM^n}{f} + 2ei_d BM^n + \frac{4kTFB}{R} \right]^{\frac{1}{2}} \right]^2.$$

The signal to noise ratio after the integrator is given by $$\left. \frac{S}{N} \right|_{out} = \frac{\overline{v_{sig}^2}}{\overline{v_n^2}}, \quad (141)$$

where $v_{sig}^2$ is given by Equation 135 and $v_n^2$ is given by Equation 140.

As an example, consider the values shown in Table 3. From Equation 131 the effective noise bandwidth of the integrator is equal to 25 Hertz. FIG. 39 in the dissertation shows the signal to noise of the system as a function of optical power of the signal pulse.

The integrating optical detector circuit of FIG. 11 can determine the energy of smaller power incident optical signals 20 at high frequency with a larger signal to noise ratio compared to the conventional photodetector circuit of FIG. 10. For electrooptic sampling according to this invention as shown in FIG. 1, the smaller the amount of coupled light 20 that can be detected, the greater the number of sampling points obtainable for an input pulse of light 17 having a power $P^{in}$ as discussed in the following section.

TABLE 3

| INTEGRATING DETECTOR EXAMPLE. | |
|---|---|
| Integrator Capacitance | C = 10 picofarads |
| Effective Resistance | R = 1 M ohm |
| Open-Loop Gain | $A_{vo}$ = 1000 |
| Avalanche Gain | M = 1 |
| Avalanche Noise | n = 2 |
| Pulse Duration | $\tau$ = 500 picoseconds |
| Integration Time | $t_1$ = 1 microsecond |
| Quantum Efficiency | $\eta$ = .5 |
| Noise Figure of Op Amp | N = 5 dB |
| Dark Current | $i_d$ = 0.3 nanoamps |
| Background Optical Signal | $P_b$ = 0 |

COUPLER CONSIDERATIONS

The maximum amount of coupling at any given coupler will have to be small in order to save some light for the last sample points. This maximum coupling requirement is dependent on how many sample points there are in the sampler. The amount of light that is available at the Mth detector will depend on the percent of coupling $C_{max}$ at the maximum coupling point. As a worst case example, consider an input waveform that forces all the couplers to couple the maximum percentage of light. The power received at the Mth coupler is then given by $$P_{rec,M} = P_{in} C_{max} [1 - C_{max}]^{m-1}, \quad (142)$$

where $P_{in}$ is the optical power into the sampler, $C_{max}$ is the maximum coupling percentage, and M is the number of couplers in the sampler. This equation can be normalized by dividing the received power by the input power. The normalized relationship is shown graphically in FIG. 40 in the dissertation.

The amount of energy that is detected at any output waveguide is determined not only from the local voltage at the associated coupler, but also from the local optical intensity at the coupler. Therefore, to reconstruct the electrical waveform the sampler must start at the first coupler and determine the instantaneous local voltage from the detected energy at the first detector. From this, the sampler must determine the amount of light that is remaining in the main optical waveguide for the subsequent couplers. This information, along with the output from the second optical detector, can be used to determine the instantaneous local voltage at the second coupler. The sampler can then proceed, using the same procedure, to the remaining detectors and determine the sample points. All of the sampler outputs can be used to reconstruct the original electrical signal taking into consideration the physical placement of the couplers and the velocities of counter-propagating optical and electrical signals.

SAMPLER DESIGN PROCEDURE

This section presents the design strategy for the integrated-optic sampler based on the theoretical work discussed thus far and published experimental data. This section will describe how the various equations and models can be incorporated together to predict the functionality of the integrated-optic sampler. The design procedure will determine the fabrication parameters required to achieve the proper waveguide indices and the physical layout required to achieve the proper optical coupling. The five steps required to design the sampler are discussed in the following sections.

STEP 1

Optical Waveguide Design

The optical waveguides in the integrated-optic sampler are fabricated by diffusing titanium into the surface of the lithium niobate crystal. This forms a graded index region that has a slightly higher index than the bulk crystal. The fabrication of the waveguides, which is described in more detail in Chapter 4 in the dissertation, consists of laying down titanium on the surface of the crystal, using photolithography to delineate the channel waveguide structure, and diffusing the titanium onto the crystal by placing it in a high temperature ($\sim$1000° C.) oven for a period of time (typically 3 to 7 hours).

There are four major fabrication variables with which one can select the desired propagation characteristics of the channel waveguide, including (1) titanium thickness, (2) oven temperature, (3) diffusion time, and (4) width of the titanium strip. The first step is to use past experimental data to determine the total index change, $\Delta n$, and the diffusion depth, Y, for a given titanium thickness, oven temperature and diffusion time. The effective index method described in Chapter 2 of the dissertation can then be applied to obtain the effective indices of the various modes of the channel waveguides.

STEP 2

Coupling Coefficient

The coupling coefficient is a constant that determines how much light couples between the two optical waveguides of a coupler. It is dependent on the material parameters, such as the refractive index, and the waveguide separation. The improved expression for coupling coefficient is given in Equation 55 of Chapter 2 in the dissertation. This expression is often written as $$K = K_o \exp\left[\frac{-d}{\xi_5}\right], \quad (143)$$

where $\xi_5$ is the field penetration depth as described in Chapter 2 in the dissertation, and $K_o$ is a constant comprised of all the other terms in Equation 55. The parameters $K_o$ and $\xi_5$ can be experimentally determined for a given set of fabrication parameters, as shown in Reference[10]. Once these two parameters are determined one can calculate the coupling coefficient as a function of waveguide separation d.

STEP 3

Coupler Layout

The couplers must be designed to give the required voltage-to-coupling response. Once the waveguide parameters and coupling coefficient are determined, the coupler layout can be initiated. This includes the interaction length, L, and the waveguide separation, d. Equation 45 of Chapter 2, which defines the difference in propagation constant, $\Delta\beta$, as a function of electrode voltage, and Equations 32 and 33, which define the optical intensity out of the two waveguides as a function of $\Delta\beta$, can be used to determine the voltage-to-coupling response for a given set of fabrication and dimensional parameters. The response can then be graphed for evaluation. The sampler requires that the couplers have a response that is asymmetric about zero in order to differentiate between positive and negative voltages. Furthermore, the couplers must be designed to have a maximum coupling of only a few percent of the initial light in order to insure that there is light available for the later couplers.

STEP 4

Sampler Parameters

Once the basic coupler configuration has been determined the sampler parameters must be determined. These parameters include the distance between the couplers, D, the length of the input optical pulse a, and the magnitude of the optical pulse, $A_o$. These parameters are chosen to provide the sampler with the required sampling rate and to insure that there will be enough light out of the output waveguides for the detectors to operate.

It will be assumed at this time that the voltage on the traveling wave electrode is a sine wave, as discussed in Case 1. One must first determine the average propagation constant that a photon experiences as it travels in an optical coupler under a coplanar traveling wave electrode as described earlier in this chapter. The input variables required for this calculation include the magnitude, $V_o$, and period $T_e$ of the sine wave, the velocity of both the optical and electrical signals in their respective media, the interaction length of the optical and electrical signals, L, and the appropriate refractive indices and electrooptic coefficients. Equation 74 can be used to calculate the average propagation constant for the configuration shown in FIG. 25 in the dissertation.

The optical power out of the couplers can then be determined using the average propagation constant $\Delta\beta$, the coupling coefficient K and the expression for the input optical signal given in Equation 65. The expressions for the optical signals out of the couplers is given by Equations 76, 77 for coupler 1 and Equations 81 and 82 for coupler 2.

STEP 5

Detector Requirements

The final step in the sampler design is to calculate the detector requirements and determine if the sampler is feasible as designed. It is assumed that the detectors integrate the power over the entire received pulse and use the integrated power or energy to determine the voltage on the electrode above the coupler.

The total energy received at the first detector is given by $$E_1 = \int_o^a P_{12}(t_o) dt_o, \quad (144)$$

where a is with length of the optical pulse in seconds and $t_o$ is again the time that the light arrives the first coupler. Using the expression for the initial optical power in Equation 65, and substituting in Equation 76 gives $$E_1 = \int_o^a |A_o|^2 P_{\frac{a}{2}}\left(\frac{x}{v_o} - t_o - \frac{a/2}{v_o}\right) \frac{\sin^2\left[KL\left[1 + \left[\frac{\Delta\beta(t_o)}{2K}\right]^2\right]^{\frac{1}{2}}\right]}{1 + \left[\frac{\Delta\beta(t_o)}{2K}\right]^2} dt_o \quad (145)$$

The pulse function from the optical signal can be taken out of the equation since the time is covered in the limits of integration. Therefore, Equation 125 can be rewritten as $$E_1 = |A_o|^2 \int_o^a \frac{\sin^2\left[KL\left[1 + \left[\frac{\overline{\Delta\beta(t_o)}}{2K}\right]^2\right]^{\frac{1}{2}}\right]}{1 + \left[\frac{\overline{\Delta\beta(t_o)}}{2K}\right]^2} dt_o. \quad (146)$$

Expressions for the output light at the other couplers can be derived in a similar manner.

SAMPLER DESIGN EXAMPLE

This section develops an example of the sampler. Table 4 outlines the overall device parameters. The first step is to determine the effective index of the channel waveguides. Using the published experimental data from Naval Research Labs[11,12] one can determine the total index change, $\Delta n$, and the diffusion depth, Y, as a function of titanium thickness, diffusion time and diffusion temperature. The waveguide fabrication parameters considered in this design are shown in Table 5.

The total index change and diffusion depth for the fabrication parameters shown in Table 6 can be estimated using the results of reference[13]. These are given by $\Delta n = 0.015$ $Y_o = 2.35$ Using these two values along with the device parameters one can use the effective index method outlined in Chapter 2 in the dissertation to determine the effective index for a planar optical waveguide and for the channel waveguides. The results of the effective index method for the above parameters are shown in Table 6.

TABLE 4

| Device Parameters | |
|---|---|
| Electrooptic Material | Lithium Niobate |
| Crystal Cut | Z-cut |
| Optical Polarization | Transverse Magnetic (TM) |
| Refractive Index | Extraordinary ($n_e$) = 2.204 |
| Optical Wavelength | $\lambda$ = 0.84 microns |
| Electrooptic Coefficient | $r_{33}$ = 30.8 × $10^{-12}$ |

TABLE 5

| Waveguide Fabrication Parameters | |
|---|---|
| Titanium Thickness | 270 Angstroms |
| Diffusion Time | 6 Hours |
| Diffusion Temperature | 1020° C. |

TABLE 6

Results of Effective Index Method
Effective Index of Planar Waveguide: 2.209141
Effective Indices of Channel Waveguides

| Width | Effective Index |
|---|---|
| 3 microns | 2.207468 |
| 3.5 microns | 2.207759 |
| 4 microns | 2.207974 |
| 4.5 microns | 2.208149 |
| 5 microns | 2.208285 |
| 5.5 microns | 2.208395 |

Once the effective indices of the waveguides has been determined the coupler layout can be initiated. A symmetric coupler can be used to get a feel for the effect of the two layout parameters on the voltage-to-coupling curves. FIG. 41 in the dissertation shows the voltage-to-coupling curves for symmetric couplers with two 4 micron waveguides and a interaction length of 2.25 millimeters. In this figure the waveguide separation is varied from 2 microns to 5 microns. FIG. 42 in the dissertation shows a similar coupler except this time the waveguide separation is kept at 3 microns and the interaction length is varied from 0.5 millimeters to 2 millimeters.

FIGS. 43 and 44 in the dissertation consider asymmetric couplers in which the input waveguide is 4 microns wide and the output waveguide is 5 microns wide. In FIG. 43 the interaction length is kept constant at 1 millimeter and the waveguide separation is varied from 2 microns to 5 microns. In FIG. 44 the waveguide separation is kept at 3 microns and the interaction length is varied from 0.5 millimeters to 2 millimeters. The results are as summarized in Table 1.

The couplers required for the sampler should have the following characteristics.

(1) A voltage-to-coupling curve that is asymmetric about zero.
(2) A maximum coupling of 5%.
(3) A monotonic curve over the voltages of interest.

With these characteristics in mind the asymmetric coupler with an interaction length of 1 millimeter and a waveguide separation of 5 microns was chosen as the initial design. In this coupler the width of the input waveguide was chosen to be 4 microns and the width of the output waveguide was chosen to be 5 microns. This led to a curve that was monotonic between −5 and +5 volts, as shown in FIG. 43d in the dissertation.

The distance between the couplers, D, was chosen to be 10 millimeters. Using Equation 114, the sampling rate is 30 Giga-samples per second. Finally, in this example the optical pulse duration was chosen to be 5 picoseconds. The sampler aperture can be determined using Equation 122 along with the previous defined parameters. In this example the aperture was 18.3 picoseconds.

An experimental electrooptic coupler 101 was constructed as shown in FIG. 14. The substrate 113 was a lithium niobate crystal (Crystal Technology, Palo Alto, Calif.) with an optical grade polish on the top surface. Channel waveguides 114,115 were formed on the top surface by the titanium in-diffusion method. The continuous or main channel waveguide 114 had a width of $w_1 = 4$ micrometers. The coupler or segment of channel waveguide 115 had a width of $w_2 = 5$ micrometers. Thus, an asymmetric coupler was formed. The spacing between channel waveguides 114,115 was $d = 4$ micrometers over an interaction length of $L \cong 2.25$ mm.

The edge faces 122,123' of the crystal were polished to facilitate end-fire coupling of the laser light pulse 118 to the optical waveguide 114. An input horn coupler 121 in the substrate 113 with a width of 40 micrometers near the input edge face 122 assisted in directing light to the main channel waveguide 114. Near the output edge face 123 of the substrate 113, the extension of the segment of the coupler channel waveguide 115' was spaced 40 micrometers from the output end of the main channel waveguide 114.

The electrodes 112,112' formed on the substrate 113 comprised a thin layer of chromium and a thin layer of gold. The T shaped electrodes had a width of 6 micrometers at the top of the T and a length of $X = 1$ millimeter parallel to the channel waveguides 114,115. The remainder of the T was a tab for electrical connections. The total electrode structure comprised two sets of adjacent electrodes 112,112' which could be used individually or together to provide a total electrode length of about 2 mm. The interaction length, L, where the channel waveguides 114,115 are closely spaced was about 2.25 millimeters. For the experiments to be described only the set of electrode 112,112' closest to the output edge face 123 were used.

As shown in FIG. 14, one electrode 112 of 6 micrometer width was placed over the main channel waveguide 114 to completely cover it. The other electrode 112' was spaced 8 micrometers from the first electrode 112 and did not cover the segment of channel waveguide 115 which was approximately midway between the two electrodes 112,112'. The experimental configuration of electrodes 112,112' relative to the waveguide 114,115, as shown in FIG. 14, was operable for experimental tests but not necessarily the optimal configuration such as when both electrodes are directly above the respective channel waveguides as shown in FIGS. 1 and 2.

The voltage characteristics of the experimental electrooptic coupler 101 shown in FIG. 14 were determined by applying direct current voltages to the electrodes 112,112'. FIG. 13 shows the experimental coupling versus voltage curve. The measured intensity of the coupled light $(P_2)$ 120 was normalized to the intensity of the input light $(P)$ 118 to the main channel waveguide 114. The intensity of light output $(P_1)$ 117 from the main channel waveguide 114 was calculated by difference $(P_1 = P − P_2)$.

The experimental electrooptic coupler 101 clearly functions as a voltage-controlled asymmetric coupler. The amount of coupled light, $P_2$, is monotonic from −40 volts of +40 volts. However, it required a great deal of voltage to achieve an appreciable change in the amount of coupled light $P_2$ i.e. the sensitivity of amount of coupled light $P_2$ to voltage (slope of line $P_2$ in FIG. 13) is low. There were three major reasons for this large voltage requirement. First, the electrodes 112,112' were not positioned optimally. As shown in FIG. 14, one of the waveguides 114 was beneath the electrode 112 while the other waveguide 115 was about halfway between the two electrodes 112,112'. This reduced the effectiveness of the electrodes 112,112' since only one of the waveguides 114 was affected by the z-oriented electric field (the z direction is perpendicular to plane of FIG. 14). Furthermore, since the electrodes 112,112' were further apart (8 micrometers rather than about 4 micrometers), the electric field was smaller for a given voltage.

The second reason for the large voltage requirement was that only one pair of electrodes 112,112' was used.

After fabrication, a short formed across the other pair of electrodes (closest to the input crystal edge 122) which made them inoperable. Thus the electric field acted only along the electrode length X=1 millimeter which was slightly less than half the interaction length L of the waveguides 114,115. The long coupling length of L≅2.25 millimeter for the experimental coupler 101 influenced the relative large amount of light coupled independent of voltage (i.e. about 40 percent at 0 volts).

The third reason for this experimental coupler 101 requiring a large voltage was that a glass buffer layer was added between the electrodes 112,112' and the waveguides 114,115. Typically when TM polarized light (i.e. light polarized perpendicular to the plane of FIG. 14) is required to propagate beneath the metal electrodes 112,112', as in the typical push-pull configuration shown in FIG. 2, a buffer layer between the waveguides 114,115 and electrodes 112,112' is often used to reduce optical attenuation. The buffer layer was fabricated by evaporating a thin (1000 Angstroms) layer of glass on the substrate after the channel waveguides 114,115, had been formed by in-diffusion of titanium. Although this technique has been used for some time, there are still many unknowns. The thin layer of glass does reduce the optical attenuation but it also tends to change the coupling characteristics of the electrooptic couplers. This is in part due to the change in dielectric constant which changes the electric field lines between the electrodes. Although, the effect of the buffer layer is not completely understood, the buffer layer is known to increase the voltage requirements by as much as 300%. Part of this is probably due to the dielectric constant of the glass affecting the electric field lines between the electrodes. Annealing of the buffer layer has been used to reduce the voltage requirements. However, this was not considered for the purpose of the present investigation.

Figure 15:
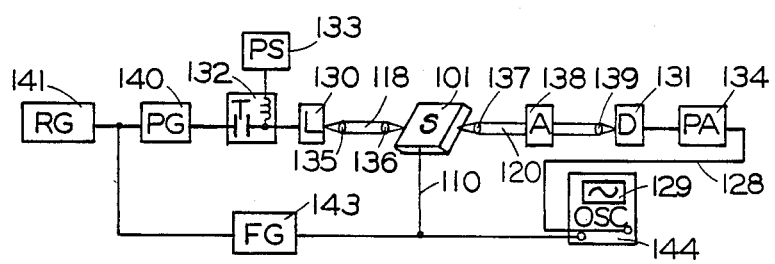
FIG. 15 is a schematic of the experimental apparatus for electrooptic sampling as disclosed herein.

The experimental electrooptic coupler 101 of FIG. 14 was used for a proof of principal demonstration of electrooptic sampling. The arrangement of components for the experimental sampler is shown in FIG. 15.

The laser diode 130 and fast optical detector 131 are the two fundamental components of the sampler electronics. The laser diode 130 that was used in the experiment (Ortel SL-310) had a 3 dB bandwidth of 3 GHz, a maximum output power of 5 milliwatts, and an optical wavelength of 0.84 microns. A bias tee 132 was used to combine the pulse input with the bias current. The bias current was delivered from a laser diode power supply 133 (Ortel LDPS-1). The laser diode 130 had a monitor photodiode to monitor the laser output. This was fed back to the power supply 133 for automatic stabilization of the CW output power.

The most sensitive detector of those considered was a silicon avalanche photodiode 131 (Mitsubishi PD-1002) which had a 3 dB bandwidth of 2 GHz and a gain bandwidth product approaching 800 GHz. A preamplifier 134 was used to amplify the photodiode output. The preamplifier 134 contained a built-in bias tee for decoupling the photodiode bias current from the signal output. The preamplifier 134 had a 3 dB bandwidth of 600 MHz and a gain of 20 dB.

A 10× microscope objective 135 was used to focus the diverging light from the laser diode 130 toward the polished input edge face 122 of the substrate 113 of the electrooptic coupler 101.

A 60× microscope objective lens 136 reduced the size of the spot of light focused on the horn coupler 121 thereby increasing the amount of light in the input waveguide channel 114.

At the polished output edge 123 of the substrate 113 of the electrooptic coupler 101, a 20× microscope objective 137 was used to collect the coupled light $(P_2)120$ from the coupler waveguide 115,115'. An adjustable aperture 138 was placed between the electrooptic coupler 101 and the detector 131 to eliminate most of the stray light from the substrate 113 and the output light $(P_1)117$ from the main waveguide 114. A 10× microscope objective 139 after the adjustable aperture 138 focused the coupled output light $(P_2)120$ onto the small (0.003 mm$^2$) active area of the detector 131.

The laser diode 130 was biased just above threshold and pulsed using a pulse generator 140 (Avtech) and a rate generator 141 (Hewlett-Packard, 8091A). The input electrical pulses (P)118 were 1.5 nanoseconds in duration and 0.4 volts in amplitude with a repetition rate of 10 MHz. The avalanche photodiode detector 131 was positioned while observing the output of preamplifier 134 with a fast oscilloscope 142 (Tektronix 7104) with real-time bandwidth of 1 GHz. The magnitude of the coupled output pulses $(P_2)120$ varied with the DC voltage applied to the electrodes 112,112' as shown in FIG. 13.

A function generator 143 (Wavetek 164) was used to apply a sine wave signal to the electrodes 112,112'. In this experiment, the electrodes 112,112' were lumped electrodes rather than traveling wave electrodes. The function generator 143 was synchronized with the 10 MHz clock of the rate generator 141 and tied to the oscilloscope 144 in order to observe the varying output on the fast oscilloscope 144.

Figure 16:
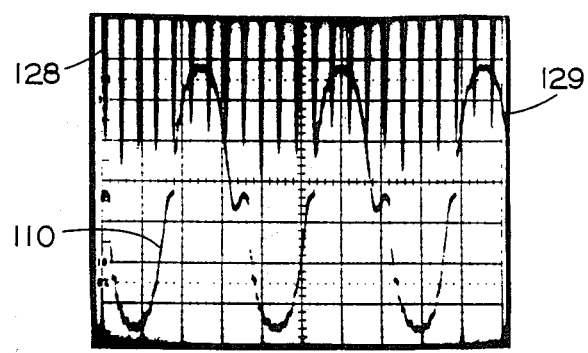
FIG. 16 is an oscilloscope photograph of experimental electooptic sampling of a sine wave electrical signal.

FIG. 16 shows the original sine wave signal 110 on the screen 129 of the oscilloscope 144 superimposed on the voltage samples 128 from the electrooptic coupler 101 and detector 131 with preamplifier 134. The variation in voltage amplitude with time of the samples 128 clearly shows the periodic variation in voltage of the sine wave signal 110. The sine wave was a 1.5 MHz electrical signal 110 that was being sampled with a series of 1.5 nanosecond optical pulses 117. Since the experimental sampler comprises only one electrooptic coupler 101, it is functioning as a single gate sampler on a repetitive waveform which demonstrates one embodiment of the present invention. The experiment demonstrated for the first time that a pulse of light can be used to determine the instantaneous voltage on an electrooptic coupler. In the above experiment, the sampling rate was determined by the repetition rate of the laser diode rather than the distance D between a plurality of electrooptic couplers as in FIG. 1. Thus, although the electrical signal used in the experiment was only a 1.5 MHz sine wave, it was sampled with a 1.5 nanosecond optical pulse which should have the ability to sample frequencies in excess of 500 MHz.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

REFERENCES

1. Taub, H., and Schilling, D. L., Principles of Communication Systems. (McGraw-Hill Book Company, New York), 1971.
2. Kawaguchi, H., and Otsuka, K., "Generation of Single-Longitudinal-Mode Gigabit-Rate Optical Pulses From Semiconductor Lasers Through Harmonic-Frequency Sinusoidal Modulation", Electronics Letters, Vol. 19, No. 17, June 28, 1983.
3. Lin, C. L., Liu, P. L., Damen, T. C., and Eilenberger, D. J., "Simple Picosecond Pulse Generation Scheme for Injection Lasers", Electronics Letters, June 25, 1980.
4. Marcatili, E. A. J., "Optical Subpicosecond Gate", Applied Optics, Vol. 19, No. 9, May 1, 1980.
5. Yariv, Amnon, Introduction to Optical Electronics, 2nd ed., (Holt, Rinehart and Winston, New York), 1971, p. 328.
6. Yariv, Amnon, Introduction to Optical Electronics, 2nd ed., (Holt, Rinehart and Winston, New York), 1971, p. 330.
7. Yariv, Amnon, Introduction to Optical Electronics, 2nd ed., (Holt, Rinehart and Winston, New York), 1971, p. 326.
8. Millman, J., and Halkias, C. C., Integrated Electronics: Analog and Digital Circuits and Systems, (McGraw-Hill Book Company, New York), 1972, p. 545.
9. Taub, H. and Schilling, D. L., Principles of Communication Systems, (McGraw-Hill Book Company, New York), 1971, p. 254.
10. Bulmer, C. H., and Burns, W. K., "Polarization Characteristics of LiNbO$_3$ Channel Waveguide Directional Couplers", Journal of Lightwave Technology, Vol. LT-1, No. 1, March, 1983.
11. Bulmer, C. H. and Burns, W. K., "Polarization Characteristics of LiNbO$_3$ Channel Waveguide Directional Couplers", Journal of Lightwave Technology, Vol. LT-1, No. 1, March, 1983.
12. Burns, W. K., Klein, P. H., and West, E. J., "Ti Diffusion in Ti: LiNbO$_3$ Planar and Channel Optical Waveguides", J. Applied Physics, Vol. 50, No. 10, October, 1979.
13. Bulmer, C. H. and Burns, W. K., "Polarization Characteristics of LiNbO$_3$ Channel Waveguide Directional Couplers", Journal of Lightwave Technology, Vol. LT-1, No. 1, March 1983.

I claim:

1. Apparatus for sampling electrical and optical signals, to show their waveforms, comprising
    substrate means comprising optical material having a planar surface,
    stripline means comprising first and second parallel electrical conducting means adjacent to the planar surface of the substrate means,
    first optical waveguide means on or integrated into the planar surface of the substrate adjacent to the first conducting means,
    a plurality of electrooptical coupling means on or integrated into the planar surface of the substrate adjacent to the second conducting means and spaced apart therealong,
    means for propagating a traveling wave electrical signal along the stripline means in a first direction to generate an electrical field across each coupling means and thus to change the coupling characteristics of said coupling means,
    means for propagating an optical signal in the first optical waveguide means along the stripline means in a second direction that is parallel to the first direction, and
    second optical waveguide means for propagating light from each coupling means to respective means responsive thereto,
    one said signal (electrical or optical) having an unknown waveform to be sampled and the other said signal (optical or electrical) having a known waveform, whereby the waveform of the sampled signal is obtainable as a function of the velocities of propagation of the known and unknown waveforms, the spacing of the coupling means, and the intensity of the light propagated from each coupling means.

2. Apparatus as in claim 1, wherein the second direction is opposite to the first direction.

3. Apparatus as in claim 1, wherein the second direction is the same as the first direction, and the electrical signal propagates at a velocity different from that of the optical signal.

4. Apparatus as in claim 1, wherein each electrooptic coupling means comprises third optical waveguide means.

5. Apparatus as in claim 1, wherein the first and third optical waveguide means differ in width, depth, shape, index of refraction, or other optical characteristic.

6. Apparatus as in claim 1, wherein the optical signal comprises a pulse having substantially constant intensity.

7. Apparatus as in claim 6, wherein the electrical signal has a waveform that is to be analyzed using the apparatus.

8. Apparatus as in claim 1, wherein the electrical signal comprises a pulse having substantially constant amplitude.

9. Apparatus as in claim 8, wherein the optical signal has an intensity-modulated waveform that is to be analyzed using the apparatus.

10. Apparatus as in claim 1, wherein each means responsive to the light propagated from the coupling means comprises optical analog to digital conversion means.

11. Apparatus as in claim 1, wherein each means responsive to the light propagated from the coupling means comprises optical analog to digital conversion means, and digital processing means responsive thereto.

12. Apparatus as in claim 1, wherein each means responsive to the light propagated from the coupling means comprises optical to electrical signal conversion means.

13. Apparatus as in claim 1, wherein each means responsive to the light propagated from the coupling means comprises optical to electrical signal conversion means, and electrical signal processing means responsive thereto.

14. Apparatus as in claim 1, wherein the means responsive to the light propagated from the coupling means comprise photodetector means and integrating means responsive thereto.

15. Apparatus as in claim 1, wherein the optical signal causes light to be coupled into each coupling means.

* * * * *